United States Patent
Hirata

[11] Patent Number: 5,838,785
[45] Date of Patent: Nov. 17, 1998

[54] VOICE LEVEL CONTROLLER

[75] Inventor: Osamu Hirata, Tokyo, Japan

[73] Assignee: Canon Kabushiki Kaisha, Tokyo, Japan

[21] Appl. No.: 384,590

[22] Filed: Feb. 3, 1995

Related U.S. Application Data

[63] Continuation of Ser. No. 201,711, Feb. 25, 1994, abandoned, which is a continuation of Ser. No. 802,284, Dec. 4, 1991, abandoned.

[30] Foreign Application Priority Data

Dec. 4, 1990 [JP] Japan .................................. 2-405374

[51] Int. Cl.⁶ .................................................. H04M 1/00
[52] U.S. Cl. .......................................... 379/395; 379/165
[58] Field of Search ..................................... 379/387, 395, 379/165, 58, 221, 93, 94, 92, 93.03, 93.14, 100.12

[56] References Cited

U.S. PATENT DOCUMENTS

| | | | |
|---|---|---|---|
| 4,258,433 | 3/1981 | Herschtal et al. | 379/93 X |
| 4,939,774 | 7/1990 | Sawada | 379/387 X |
| 5,070,524 | 12/1991 | Mano | 379/395 X |
| 5,173,933 | 12/1992 | Jabs et al. | 379/221 X |

FOREIGN PATENT DOCUMENTS

| | | |
|---|---|---|
| WOA8000289 | 2/1980 | European Pat. Off. . |
| 0058982 | 9/1982 | European Pat. Off. . |
| 318661 | 6/1989 | European Pat. Off. . |
| 0392816 | 10/1990 | European Pat. Off. . |
| 56-90666 | 7/1981 | Japan . |
| 58-124357 | 7/1983 | Japan . |
| 59-44188 | 6/1984 | Japan . |
| 2159019 | 11/1985 | United Kingdom . |
| 2212363 | 7/1989 | United Kingdom . |

*Primary Examiner*—Jack Chiang
*Attorney, Agent, or Firm*—Fitzpatrick, Cella, Harper & Scinto

[57] ABSTRACT

A voice level controller comprises a discriminator for determining whether speech is transmitted through an analog line or not, and a control circuit for controlling a speech level in accordance with the output of the discriminator.

26 Claims, 4 Drawing Sheets

FIG. 4

| 8 | 7 | 6 | 5 | 4 | 3 | 2 | 1 | |
|---|---|---|---|---|---|---|---|---|
| 0 | 0 | 0 | 1 | 1 | 1 | 1 | 0 | ···OCTET 1 |
| LENGTH OF CONTENTS ||||||||  ···OCTET 2 |
| 1 | CODING STANDARD || 0 | GENERATION SOURCE |||| ···OCTET 3 |
| 1 | PROGRESS CONTENTS ||||||| ···OCTET 4 |

FIG. 5

| 7 6 5 4 3 2 1 | NUMBER | CONTENTS |
|---|---|---|
| 0 0 0 0 0 0 1 | #1 | CALL IS NOT ISDN END·END, IN-BAND SIGNAL USABLE |
| 0 0 0 0 0 1 0 | #2 | NON ISDN RECEPTION SIDE ADDRESS |
| 0 0 0 0 0 1 1 | #3 | NON ISDN GENERATION SIDE ADDRESS |
| 0 0 0 0 1 0 0 | #4 | RETURN OF CALL TO ISDN |
| 0 0 0 1 0 0 0 | #8 | IN-BAND SIGNAL USABLE |

VOICE LEVEL CONTROLLER

This application is a continuation of application Ser. No. 08/201,711 filed Feb. 25, 1994 now abandoned, which is a continuation of application Ser. No. 07/802,284 filed Dec. 4, 1991, now abandoned.

BACKGROUND OF THE INVENTION

1. Field of the Invention

The present invention relates to an apparatus for controlling voice signal levels received from a digital network.

2. Related Background Art

At present, there are analog PSTN networks and digital ISDN networks which networks may be interconnected. In the PSTN analog network, a sending signal and a received signal are in the same voice band and the PSTN network which accommodates a subscriber uses a 2–4 line converter to separate the sending signal and the received signal.

However, since it is difficult to completely separate the sending signal and the received signal by the 2–4 line converter, howling may be generated unless a loss is inserted to lower the voice level.

SUMMARY OF THE INVENTION

It is an object of the present invention to enable a received voice to be heard at a preferred voice level without regard to the type of network connecting a calling station.

It is another object of the present invention to enable a received voice to be heard at the preferred voice level whether an analog network connecting the calling station is present or not.

Other objects of the present invention will be apparent from the following description of the embodiments of the present invention.

BRIEF DESCRIPTION OF THE DRAWINGS

FIG. 4 shows a format of a "progress identifier" information element; and

FIG. 5 shows an assignment of "progress content".

DETAILED DESCRIPTION OF THE PREFERRED EMBODIMENTS

An embodiment of the present invention is now explained with reference to the drawings.

Figure 2:
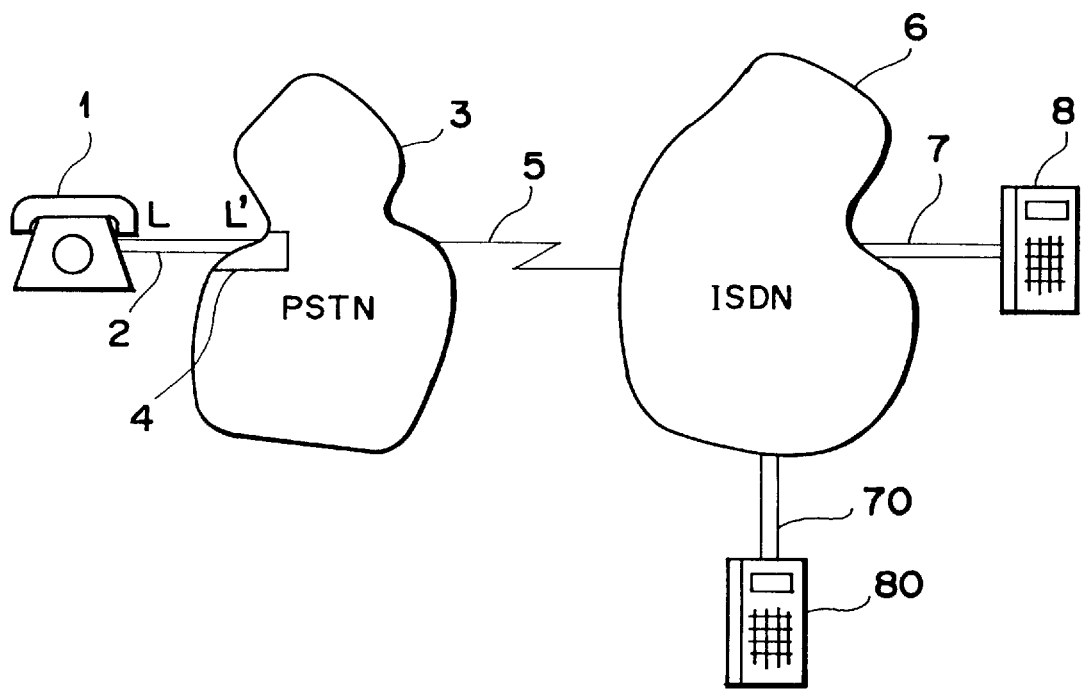
FIG. 2 shows a configuration of a network.

FIG. 2 shows a network configuration in which a PSTN network and an ISDN network are interconnected. Numeral 1 denotes an analog telephone set, numeral 2 denotes a subscriber line, numeral 3 denotes a PSTN network, numeral 4 denotes a 2–4 line converter, numeral 5 denotes an internetwork base transmission line, numeral 6 denotes an ISDN network, numerals 7 and 70 denote ISDN lines, and numerals 8 and 80 denote digital telephone sets having speech level controllers in accordance with the present invention.

An operation of the network of FIG. 2 is now explained. The telephone set 8 is connected to the telephone set 80 through the ISDN network 6 and the ISDN lines 7 and 70 so that the telephone sets 8 and 80 communicate by a digital signal. In this case, a digital link is formed and a loss of voice does not take place on the network 6 or the lines 7 and 70.

The PSTN network 3 which is the analog network and the ISDN network 6 interconnect by a digital signal through the internetwork base transmission line 5. The analog telephone set 1 is connected to the PSTN network 3 through the subscriber line 2 and the 2–4 line converter 4. Because the analog telephone set 1 is accommodated in the PSTN network 3, a level loss $L_1$ on the subscriber line 2 and a level loss $L_2$ on the 2–4 line converter 4 take place. $L_1$ is in the range of 0 to 7 dB, and 3 to 4 dB on average while $L_2$ is approximately 8 dB. Thus, $L_1+L_2$ is 14 to 16 dB in average. The telephone set 8 accommodated in the ISDN network 6 may communicate with both the telephone set 80 accommodated in the ISDN network 6 and the telephone set connected to the PSTN network 3. There is a voice level difference of 14 to 16 dB between the telephone sets 8 and 80 and between the telephone sets 8 and 1. In the present embodiment, the voice level difference between the telephone sets 8 and 1 is eliminated in the telephone set 8.

Figure 1:
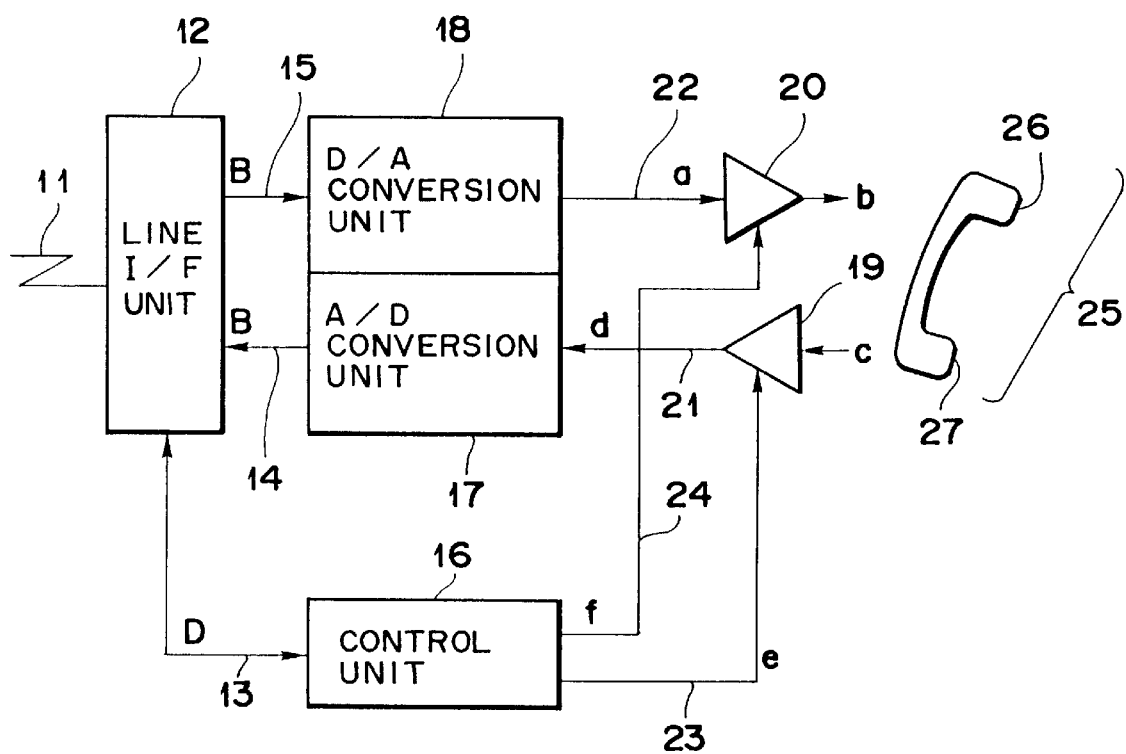
FIG. 1 shows a circuit diagram of a telephone set having a speech level controller in accordance with the present invention.

FIG. 1 shows a circuit diagram of a digital telephone set having a speech level controller in accordance with the present invention. Numeral 11 denotes an ISDN line, and numeral 12 denotes a line interface which is an interface to the ISDN line 11. The line interface 12 sends and receives a D channel control signal through a signal line 13, sends a B channel signal through a signal line 15 and receives a B channel signal through a signal line 14. Numeral 16 denotes a control unit which controls the overall system. It is connected to the line interface 12 through the signal line 13 through which a call control signal (D channel control signal) is exchanged. Numeral 17 denotes a codec for converting an analog signal to a digital signal, and numeral 18 denotes a codec for converting a digital signal to an analog signal. Numerals 19 and 20 denote amplifiers, numerals 21 to 24 denote signal lines, numeral 25 denotes a hand set, numeral 26 denotes a receiver of the hand set 25, and numeral 27 denotes a transmitter of the hand set 25.

A signal a from the codec 18 is supplied to the amplifier 20 through the signal line 22, and a signal b from the amplifier 20 is sent to the receiver 26 of the hand set 25 so that the receiver 26 reproduces the voice. On the other hand, a signal c inputted from the transmitter 27 of the hand set 25 is sent to the amplifier 19, and a signal d from the amplifier 19 is supplied to the codec 17 through the signal line 21. The amplification factors of the amplifiers 19 and 20 are controlled by signals e and f supplied from the control unit 16 through the signal lines 23 and 24.

Figure 3:
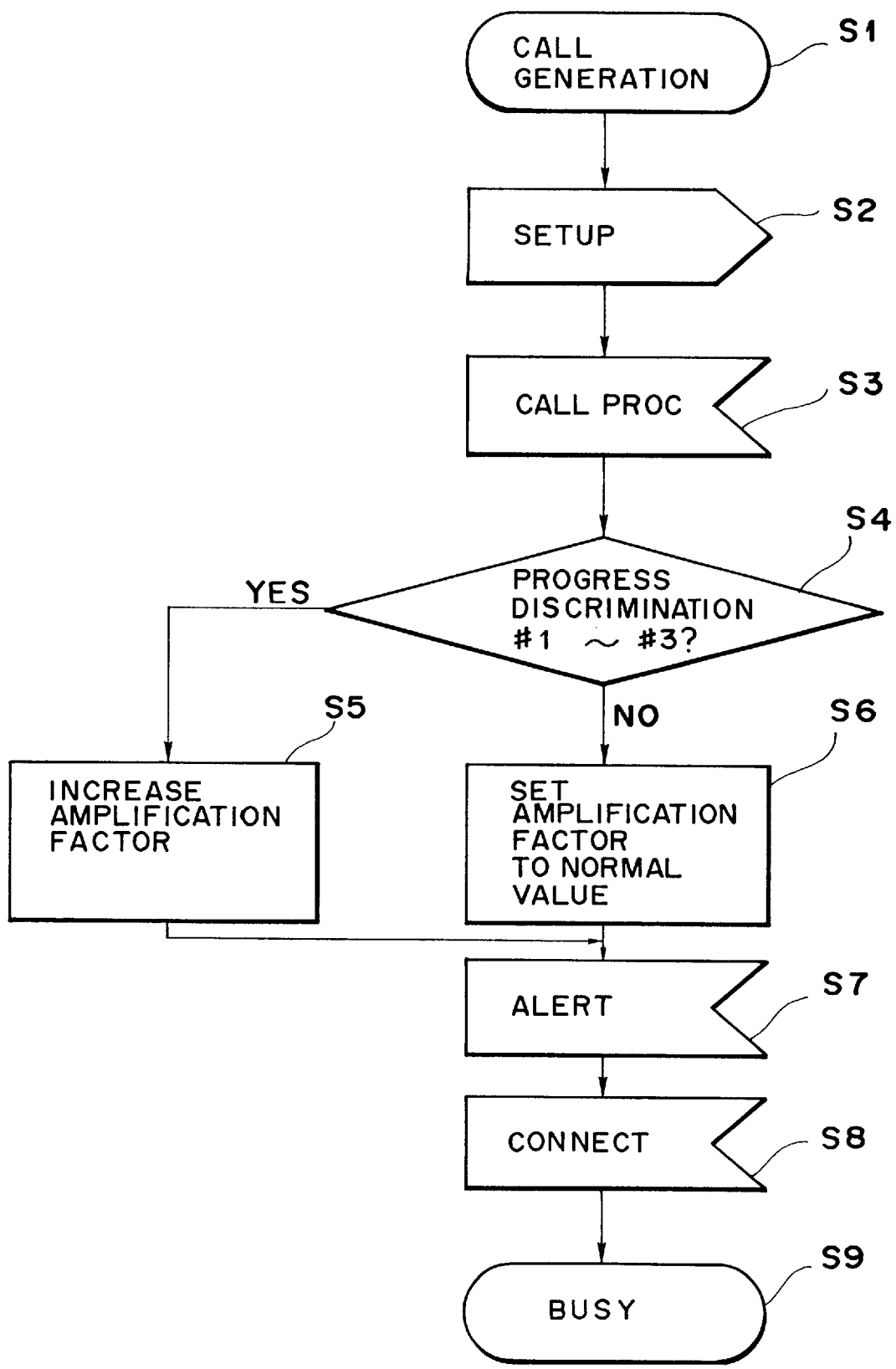
FIG. 3 shows a flow chart of an operation of the apparatus of FIG. 1.

The operation of the telephone set of FIG. 1 is now explained with reference to FIGS. 3 to 5. FIG. 3 shows a flow chart of a send process of the digital telephone set. When an operator dials to request a call (step S1), the line interface 12 (FIG. 1) sends to the ISDN line 7 (FIG. 2) a SETUP message as the D channel information in accordance with a command from the control unit 16 (FIG. 1) (step S2). In response thereto, the ISDN network 6 sends back a CALL PROC message (step S3). The control unit 16 controls the two amplifiers 19 and 20 to connect the speech path in accordance with a "progress identifier" information element contained in the CALL PROC message. A format of the "progress identifier" is shown in FIG. 4. Horizontal numerals 1 to 8 indicate bits. The "progress content" in octet 4 has an assignment as shown in FIG. 5, in which non-ISDN network is assigned to #1–#3. Thus, when the "progress content" of the "progress identifier" is #1, #2 or #3, the control unit 16 increases the amplification factor (step S5), and when it is #4 or #8 which indicates the end-end of the digital network, the control unit 16 sets the amplification factor to a normal level (step S6). Alternatively, when the "progress identifier" is #1, #2 or #3, the amplification factor may be set to the normal level, and when it is #4 or #8, the amplification factor may be lowered. Further, the digital signal before the conversion to the analog signal may be level-shifted in accordance with the "progress identifier". When a called station is later connected, an ALERT message is sent from the network 6 (step S7), and when the called station responds, a CONNECT message is sent from the network 6 (step S8) so that the speech status is established (step S9).

In case that the "progress identifier" is not contained in the CALL PROC message, it is contained in the ALERT or CONNECT message. Thus, the decision of the step S4 is made each time the message is received.

In the receiving mode, the "progress identifier" is contained in the ALERT message.

In the present embodiment, the speech level controller in the telephone set has been described. Alternatively, the speech level may be controlled in a key telephone set or a PBX which accommodates the ISDN line.

When the present invention is applied to the PBX, the speech level control may be used to automatically set a constant speech level when a call from an external line is transferred to another external line or when a conference speech with two external lines and one internal line is made.

While a preferred embodiment of the present invention has been described above, the present invention is not limited to the above embodiment but various modifications thereof may be made without departing from the scope of claims.

I claim:

1. A signal level controller for an outgoing call of a calling station comprising:
    sending means coupled to an ISDN for sending a SETUP message to the ISDN;
    receiving means coupled to the ISDN for receiving a CALL PROCEEDING message including a Progress identifier formed in the ISDN in response to the SET UP message for informing the calling station whether a station called by the outgoing call of the calling station is connected to an analog network or a digital network; and
    control means coupled to the receiving means for controlling a signal level of the station called by the outgoing call of the calling station in accordance with the Progress identifier received by said receiving means.

2. A method for controlling a signal level of an outgoing call at a calling station, comprising the steps of:
    sending an outgoing call signal including a SETUP message to an ISDN;
    receiving a CALL PROCEEDING message including a Progress identifier formed in the ISDN in response to the SETUP message for informing the calling station whether a station called by the outgoing call of the calling station is connected to an analog network or a digital network; and
    controlling a signal level of the station called by the outgoing call of the calling station in accordance with the received Progress identifier.

3. A method according to claim 2, wherein, in said controlling step, the signal level is raised in a case where the called station is connected to the analog network.

4. A method according to claim 2, wherein, in said controlling step, the signal level of an audio signal supplied from the ISDN is controlled.

5. A method according to claim 2, wherein said controlling step further comprises a step of converting a digital audio signal from the ISDN into an analog audio signal, and a step of controlling the audio level of the analog audio signal.

6. A controller according to claim 1, wherein said control means raises the signal level in a case where the called station is connected to the analog network.

7. A controller according to claim 1, wherein said control means controls the signal level of an audio signal supplied from the ISDN.

8. A controller according to claim 1, wherein said control means further comprises conversion means for converting a digital audio signal supplied from the ISDN into an analog audio signal and controlling the audio level of the analog audio signal.

9. A controller according to claim 1, wherein said receiving means receives the Progress identifier included in one of the CALL PROCEEDING message, an ALERTING message and a CONNECT message.

10. A method according to claim 2, wherein the Progress identifier included in one of the CALL PROCEEDING message, an ALERTING message and a CONNECT message is received in said receiving step.

11. A signal level controller for an outgoing call of a calling station comprising:
    sending means coupled to an ISDN for sending a SETUP message to the ISDN;
    receiving means coupled to the ISDN for receiving an ALERTING message including a Progress identifier formed in the ISDN in response to the SETUP message for informing the calling station whether a station called by the outgoing call of the calling station is connected to an analog network or a digital network; and
    control means coupled to the receiving means for controlling a signal level of the station called by the outgoing call of the calling station in accordance with the Progress identifier received by said receiving means.

12. A controller according to claim 11, wherein said control means raises the signal level in a case where the called station is connected to the analog network.

13. A controller according to claim 11, wherein said control means controls the signal level of an audio signal supplied from the ISDN.

14. A controller according to claim 11, wherein said control means further comprises conversion means for converting a digital audio signal supplied from the ISDN into an analog audio signal and for controlling the audio level of the analog audio signal.

15. A method for controlling a signal level of an outgoing call at a calling station, comprising the steps of:
    sending an outgoing call signal including a SETUP message to an ISDN;
    receiving an ALERTING message including a progress identifier formed in the ISDN in response to the SETUP message for informing the calling station whether a station called by the outgoing call of the calling station is connected to an analog network or a digital network; and
    controlling a signal level of the station called by the outgoing call of the calling station in accordance with the received Progress identifier.

16. A method according to claim 15, wherein, in said controlling step, the signal level is raised in a case where the called station is connected to the analog network.

17. A method according to claim 15, wherein, in said controlling step, the signal level of an audio signal supplied from the ISDN is controlled.

18. A method according to claim 15, wherein said controlling step further comprises a step of converting a digital audio signal from the ISDN into an analog audio signal, and a step of controlling the level of the analog audio signal.

19. A signal level controller for an outgoing call of a calling station comprising:

sending means coupled to an ISDN for sending a SETUP message to the ISDN;

receiving means coupled to the ISDN for receiving a CONNECT message including a Progress identifier formed in the ISDN in response to the SETUP message for informing the calling station whether a station called by the outgoing call of the calling station is connected to an analog network or a digital network; and control means coupled to the receiving means for controlling a signal level of the station called by the outgoing call of the calling station in accordance with the Progress identifier received by said receiving means.

20. A controller according to claim 19, wherein said control means raises the signal level in a case where the called station is connected to the analog network.

21. A controller according to claim 19, wherein said control means controls the signal level of an audio signal supplied from the ISDN.

22. A controller according to claim 19, wherein said control means further comprises conversion means for converting a digital audio signal supplied from the ISDN into an analog audio signal and controlling the level of the analog audio signal.

23. A method for controlling a signal level of an outgoing call at a calling station, comprising the steps of:

sending an outgoing call signal including a SETUP message to an ISDN;

receiving a CONNECT message including a Progress identifier formed in the ISDN in response to the SETUP message for informing the calling station whether a station called by the outgoing call of the calling station is connected to an analog network or a digital network; and controlling a signal level of the station called by the outgoing call of the calling station in accordance with the received Progress identifier.

24. A method according to claim 23, wherein, in said controlling step, the signal level is raised in a case where the called station is connected to the analog network.

25. A method according to claim 23, wherein, in said controlling step, the signal level of an audio signal supplied from the ISDN is controlled.

26. A method according to claim 23, wherein said controlling step further comprises a step of converting a digital audio signal from the ISDN into an analog audio signal, and a step of controlling the level of the analog audio signal.

* * * * *

UNITED STATES PATENT AND TRADEMARK OFFICE
CERTIFICATE OF CORRECTION

PATENT NO.   : 5,838,785

DATED        : November 17, 1998

INVENTOR(S)  : OSAMU HIRATA

It is certified that error appears in the above-identified patent and that said Letters Patent is hereby corrected as shown below:

COLUMN 3

Line 41, "SET" should read --SETUP--
    Line 42, "UP" should be deleted.

Signed and Sealed this

Twenty-sixth Day of October, 1999

Attest:

Q. TODD DICKINSON

*Attesting Officer*    *Acting Commissioner of Patents and Trademarks*